US010156750B2

(12) United States Patent
Cho et al.

(10) Patent No.: US 10,156,750 B2
(45) Date of Patent: Dec. 18, 2018

(54) BACKLIGHT UNIT AND DISPLAY DEVICE USING THE SAME

(71) Applicant: LG Display Co., Ltd., Seoul (KR)

(72) Inventors: Yongjun Cho, Gunpo-si (KR); Hoyoung Cheon, Goyang-si (KR); Hyunwoo Cho, Gumi-si (KR); Chanwook Choi, Seoul (KR); Seongjin Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/608,702

(22) Filed: May 30, 2017

(65) Prior Publication Data

US 2017/0343841 A1  Nov. 30, 2017

(30) Foreign Application Priority Data

May 31, 2016 (KR) .......................... 10-2016-0067564

(51) Int. Cl.
*F21V 7/04* (2006.01)
*G02F 1/1335* (2006.01)
*F21V 8/00* (2006.01)
*H01L 33/50* (2010.01)
*G02F 1/1333* (2006.01)

(52) U.S. Cl.
CPC ......... *G02F 1/1335* (2013.01); *G02B 6/0026* (2013.01); *G02B 6/0073* (2013.01); *G02B 6/0091* (2013.01); *G02F 1/133308* (2013.01); *G02F 1/133615* (2013.01); *G02F 1/133617* (2013.01); *H01L 33/50* (2013.01); *G02F 2001/133317* (2013.01); *G02F 2001/133322* (2013.01)

(58) Field of Classification Search
CPC ................ G02B 6/0026; G02B 6/0033; G02B 6/005–6/0055; G02B 6/0086–6/0088; G02B 6/0091; G02F 1/133308; G02F 1/133322; G02F 1/1335; G02F 1/133615; G02F 1/133617; G02F 2001/133322; G02F 2001/13356; G02F 2001/133562; H01L 33/50
USPC ................................. 362/606–607, 632–634
See application file for complete search history.

(56) References Cited

U.S. PATENT DOCUMENTS 7,224,416 B2 *  5/2007  Cha ...................... G02B 6/0088
                                            349/58
2015/0355404 A1 * 12/2015 Lee ...................... G02B 6/0088
                                            362/606

* cited by examiner

Primary Examiner — Jason M Han
(74) Attorney, Agent, or Firm — Fenwick & West LLP (57) ABSTRACT

Provided are a backlight unit and a display device using the same. The backlight unit includes a main support, in which a sheet ear part of an optical sheet is disposed, having a sheet mounting part and an upper hole, a sheet mounting member for mounting the sheet ear part of the optical sheet and formed with a lower hole, and a sheet fixating mechanism coupled to the main support, the optical sheet, and the sheet mounting member to fix the sheet ear part of the optical sheet to the main support. A narrow bezel may be implemented, an optical sheet may be stably secured even in the narrow bezel, and light leakage may be prevented.

19 Claims, 6 Drawing Sheets

BACKLIGHT UNIT AND DISPLAY DEVICE USING THE SAME

CROSS-REFERENCE TO RELATED APPLICATION

This application claims priority under 35 U.S.C. § 119(a) to Republic of Korea Patent Application No. 10-2016-0067564 filed on May 31, 2016, which is incorporated by reference herein in its entirety.

BACKGROUND

1. Technical Field

The present disclosure relates to a backlight unit and a display device using the same.

2. Related Art

In general, liquid crystal displays (LCD), which are light in weight, thin, and driven at low power consumption, have extended applications, and are used in a portable computing devices such as a notebook computer, office automation systems, audio/video systems, and interior and exterior advertisement display devices.

LCDs are mostly transmissive LCDs displaying an image by modulating light incident from a backlight unit by controlling a field applied to a liquid crystal layer.

Backlight units may be classified as a direct type backlight unit or an edge type backlight unit. In the direct type backlight unit, a plurality of light sources are disposed on a lower surface of a diffusion plate to allow light to travel to a rear surface of a liquid crystal panel. The edge type backlight unit includes a light guide plate and a plurality of light sources disposed to face a side of the light guide plate.

The edge type backlight unit converts linear light or point light incident from a light source into planar light on a light guide plate and forces converted light to travel to a rear surface of a liquid crystal display panel.

The back light unit includes an optical sheet for increasing brightness by refracting or collecting light, and a main support supporting the optical sheet.

In particular, in the direct type backlight unit, an optical sheet is disposed between a diffusion plate and a liquid crystal panel, and in the edge type backlight unit, the optical sheet is disposed between the light guide plate and the liquid crystal panel.

Also, the main support supports components included in the backlight unit such as the optical sheet.

SUMMARY

The present disclosure provides a backlight unit capable of implementing a narrow bezel, stably fixating a sheet even in the narrow bezel, and preventing light leakage, and a display device using the same.

To achieve these and other advantages and in accordance with the disclosure, as embodied and broadly described herein, a backlight unit includes: a light source providing light; an optical sheet including a sheet ear part extending from one side and formed with an ear part hole; a main support, in which the sheet ear part of the optical sheet is disposed, formed with a sheet mounting part defined by a carved out bottom portion of the main support between main support fastening parts of the main support, and formed with an upper hole; a sheet mounting member inserted into the sheet mounting part of the main support to engage the main support fastening parts with the sheet ear part between an upper surface of the sheet mounting member and the bottom portion of the main support, and formed with a lower hole that aligns with the ear part hole and the upper hole; and a fixating pin inserted through the upper hole of the main support, the ear part hole of the optical sheet, and the lower hole of the sheet mounting member to secure the sheet ear part of the optical sheet between the main support and the sheet mounting member.

The sheet mounting member may include at least one sheet mounting member fastening part configured to engage with at least one of the main support fastening parts to restrict movement of the sheet mounting member relative to the main support.

The sheet fixating mechanism may include: a fixating pin maintaining part disposed an upper surface of the fixating pin and an auxiliary foam pad provided on an upper surface of the fixating pin maintaining part. The fixating pin maintaining part may have a greater width than the upper hole, and the auxiliary foam pad may have the same width as the fixating pin maintaining part.

The sheet mounting member may include: sheet mounting member fastening parts that engage with the main support fastening parts and a sheet guiding part between the sheet mounting member fastening parts having a thickness thinner than a thickness of the sheet mounting member fastening parts, where the sheet guiding part is formed with a lower hole.

Each of the main support fastening parts of the sheet mounting member may include a protrusion protruding in a direction parallel to an upper surface of the sheet guiding part, the protrusion coming into contact with one of the main support fastening parts.

The sheet mounting member may be pushed in an inward direction towards the optical sheet for receiving the fixation pin in the lower hole.

The sheet mounting member may be inserted upwards towards the upper surface of the sheet mounting member for receiving the fixation pin in the lower hole.

To achieve these and other advantages and in accordance with the purpose of this specification, as embodied and broadly described herein, a display device using a backlight unit includes: the backlight unit; and a display panel displaying an image using light provided from the backlight unit.

In the backlight unit and the display device using the same according to an embodiment of the present disclosure, since the optical sheet is stably secured using the fixating pin and the sheet mounting member, the backlight unit and the display device using the same may be applied to a model of a narrow bezel.

Also, in the backlight unit and the display device using the same according to an embodiment of the present disclosure, since the optical sheet is secured using the fixating pin and the sheet mounting member, the optical sheet is prevented from being damaged, unlike the related art method of coupling the sheet ear part and the protrusion.

Also, in the backlight unit and the display device using the same according to an embodiment of the present disclosure, since the sheet is vertically tightly attached and stably secured by inserting the fixating pins to the holes provided in the main support, the sheet ear part, and the sheet mounting member, the sheet may be prevented from being released when a mechanical test and transportation environment, and a horizontal movement of the sheet may be minimized.

Also, in the backlight unit and the display device using the same according to an embodiment of the present disclosure, the sheet is tightly attached and secured to the main support without a gap by inserting the fixating pins to the main support, the sheet ear part, and the holes provided in the sheet mounting member, and since the upper part of the fixating pin and the main support are covered using a foam pad, light leakage may be effectively prevented.

Also, in the backlight unit and the display device using the same according to an embodiment of the present disclosure, since the sheet may be secured using the fixating pin mechanism and the auxiliary foam pad bonded to each other and the area excluding the sheet fixating mechanism and the auxiliary foam pad bonded to each other, i.e., the upper part of the main support, is covered using the foam pad, a sheet assembly process and an assembly time required for the process may be shortened.

Further scope of applicability of the present application will become more apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from the detailed description.

BRIEF DESCRIPTION OF THE DRAWINGS

The accompanying drawings, which are included to provide a further understanding of embodiments of the invention and are incorporated in and constitute a part of this disclosure, illustrate embodiments and together with the description serve to explain the principles of the embodiments.

DETAILED DESCRIPTION

The aforementioned objects, features and advantages of embodiments of the present invention will become more apparent through the following detailed description with respect to the accompanying drawings. In adding reference numerals for elements in each figure, it should be noted that like reference numerals already used to denote like elements in other figures are used for elements wherever possible.

Also, while terms such as "first" and "second," etc., may be used to describe various components, such components must not be understood as being limited to the above terms. In the description of the present disclosure, when it is determined that the detailed description of the related art would obscure the gist of the present disclosure, the description thereof will be omitted.

Hereinafter, embodiments of the present disclosure will be described in detail with reference to the accompanying drawings.

Figure 1:
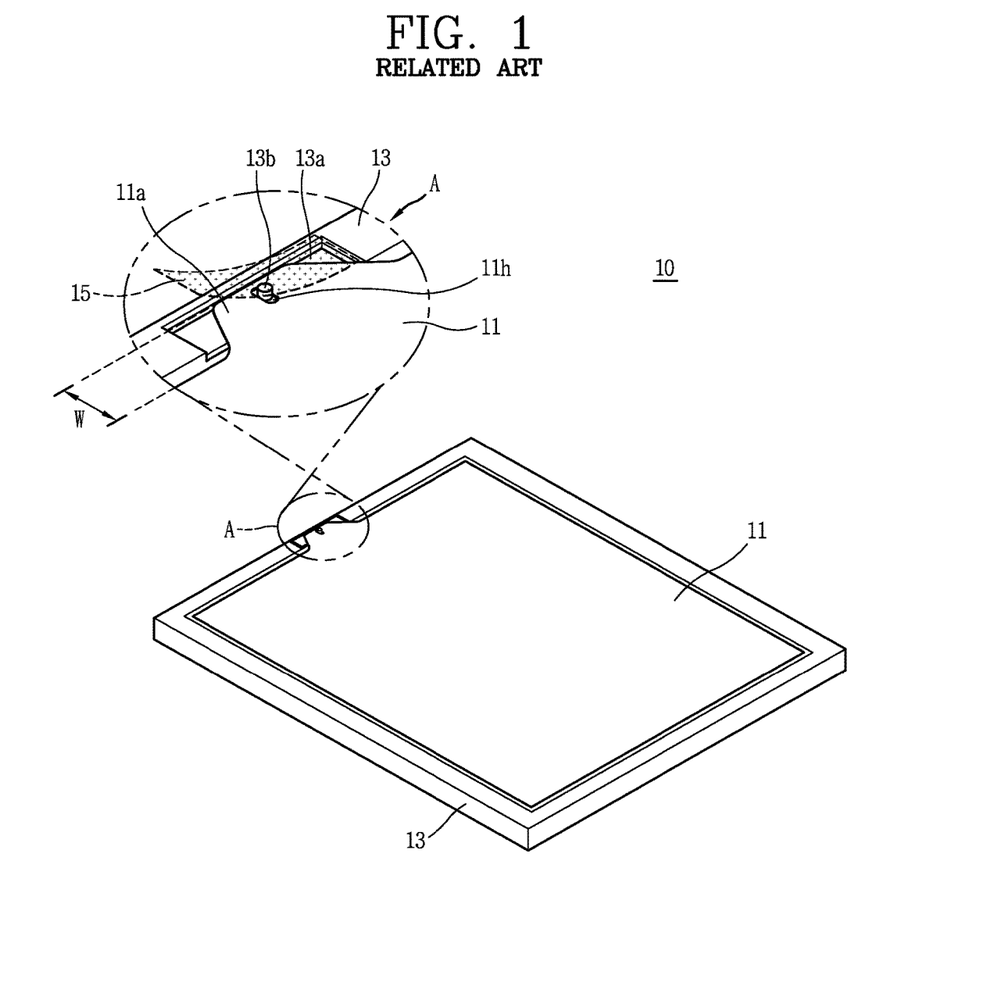
FIG. 1 is a perspective view of a related art display device according to an embodiment.

FIG. 1 is a perspective view of a related art display device according to an embodiment. Referring to FIG. 1, the related art display device 10 includes a cover bottom (not shown) having a receiving space, a light guide plate (not shown) received in the receiving space of the cover bottom, a light source (not shown) received in the receiving space to irradiate light to the light guide plate, a reflective sheet (not shown) disposed below the light guide plate, a main support 13 having a shape of a rectangular frame, surrounding an outer surface of the cover bottom, and allowing a liquid crystal panel (not shown) to be disposed therein, and an optical sheet 11 disposed on the light guide plate.

The main support 13 has a rectangular shape to surround the cover bottom, and a sheet mounting part 13a is provided at an upper surface to allow an sheet ear part 11a of the optical sheet 11 to be disposed therein, and a protrusion 13b is formed to protrude from the sheet mounting part 13b.

Also, the optical sheet 11 includes the sheet ear part 11a extending in one direction and having a hole 11h.

As indicated by "A", the sheet ear part 11a of the optical sheet 11 is coupled to the protrusion 13b protruding in a direction of the main support 13. As the protrusion 13b is inserted into the hole 11h formed in the sheet ear part 11a, the optical sheet 11 is coupled to the main support 13.

In this manner, in the related art display device 10, the protrusion 13b provided in the main support 13 is inserted to the sheet ear part 11a using the hole 11h provided in the sheet ear part 11a of the optical sheet 11 to fasten the optical sheet 11.

Also, the optical sheet 11 is secured by bonding a fixating tape 15 to the sheet ear part 11a around the protrusion 13b.

However, the sheet ear part 11a provided in the optical sheet 11 has a width W, and thus, a width of an upper surface of the main support 13 where the sheet ear part 11a is disposed and fastened is required to be greater than the width W of the sheet ear part 11a.

Thus, there is a limitation in reducing a width of the upper surface of the main support 13 to reduce a bezel width.

In particular, since a width of the bezel of the display device 10 is increased due to the width W of the sheet ear part 11a protruding from a side surface of the optical sheet 11 inserted and fastened to the protrusion 13b provided on the upper surface of the main support 13, it is difficult and challenging to implement a narrow bezel.

Also, existing display devices 10 have a large bezel width, and thus, although a width of the sheet ear part 11a of the sheet is large, the sheet ear part 11a may be secured to the upper surface of the main support 13.

However, recently, display devices 10 tend to have bezel widths that are decreased as much as possible, and in order to decrease the bezel width, a width of the main support 13 positioned at an edge of a display device 10. However, there are many restrictions in fixating the sheet ear part 11a to the upper surface of the main support 13.

In particular, when the display device 10 is manufactured or used for a long period of time, for example, during mechanical testing or in a transportation environment, the sheet ear part 11a of the optical sheet 11 may become released from the protrusion 13b or damaged due to movement by the protrusion 13b.

In addition, in the related art, an escape shape, i.e., a protrusion, may be included in the main support 13 to fixate the optical sheet 11, but a display device 10 having a narrow bezel does not have enough space for such an escape shape.

Also, a slight step or gap may be formed between the sheet mounting part 13b on the upper surface of the main support 13 where the sheet ear part 11a is disposed and the sheet ear part 11a. A slight step of gap may also be formed between the protrusion 13b and the hole 11h of the sheet ear part 11a, through which light is leaked.

In particular, as a bezel region is reduced, the optical sheet 11 is inserted and assembled into the protrusion 13b formed in the main support 13, and an adhesive fixating tape 15 is attached thereto to fixate the optical sheet 11. Here, however, light is leaked through an assembly gap between the fixating tape 15, the optical sheet 11, and the protrusion 13b.

Thus, due to the light leakage, the existing structure may not be applied to a display device without a top case.

Figure 2:
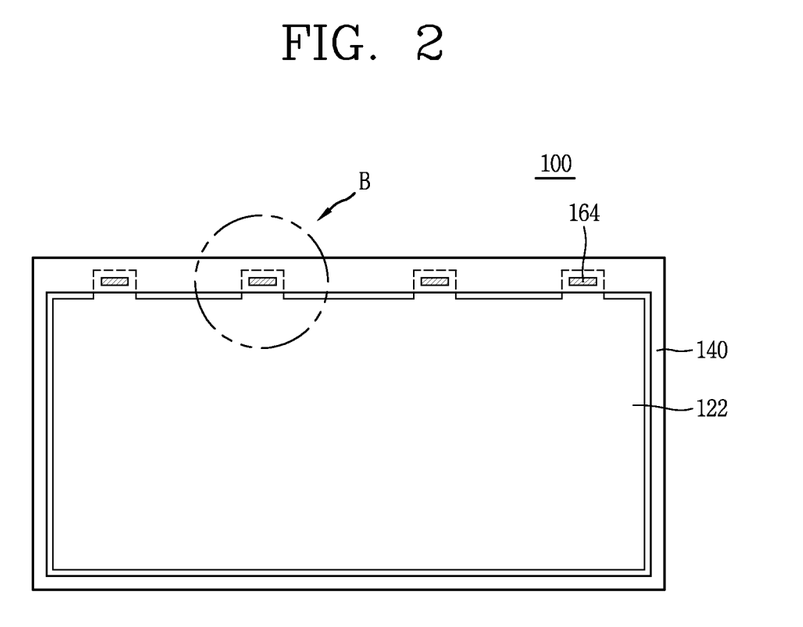
FIG. 2 is a plan view of a display device according to an embodiment.

FIG. 2 is a plan view of a display device 100 according to an embodiment.

Figure 3:
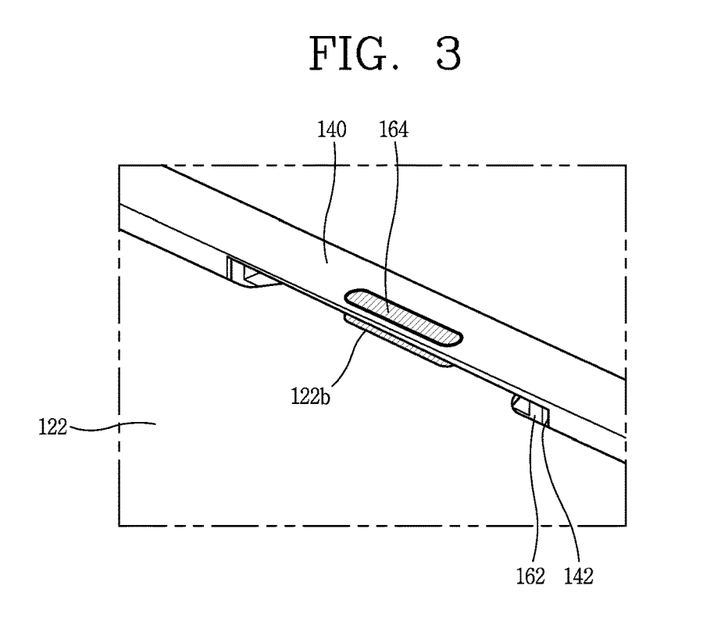
FIG. 3 is an enlarged perspective view of a part "B" of FIG. 2, illustrating an optical sheet of a display device according to an embodiment.

FIG. 3 is an enlarged perspective view of a part "B" of FIG. 2, illustrating the optical sheet 122 of a display device 100 according to an embodiment.

Figure 4:
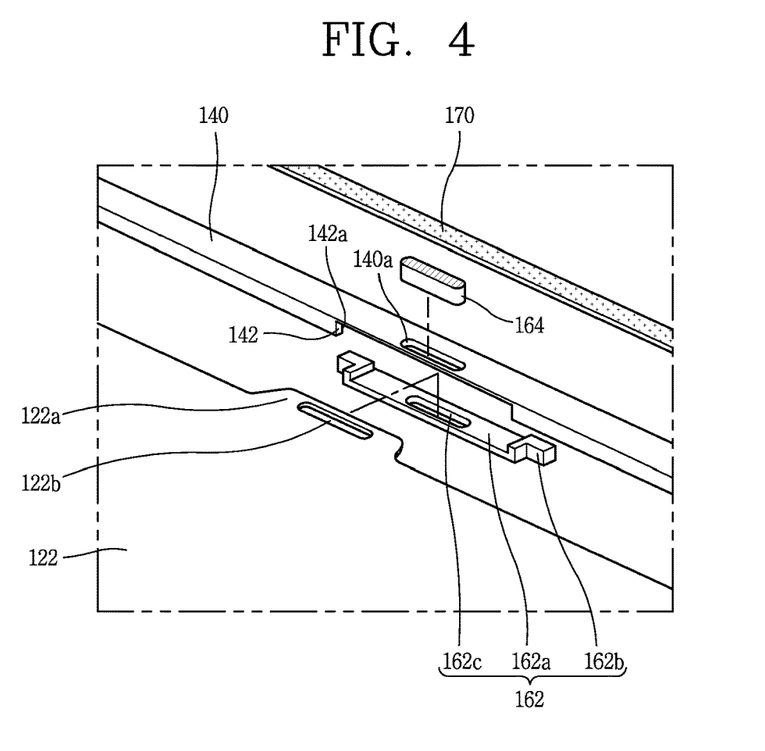
FIG. 4 is an enlarged exploded perspective view of the part "B" of FIG. 2, illustrating that an optical sheet of a display device is disassembled according to an embodiment.

FIG. 4 is an enlarged exploded perspective view of the part "B" of FIG. 2, illustrating that an optical sheet 122 of the display device 100 is disassembled according to an embodiment.

Figure 5:
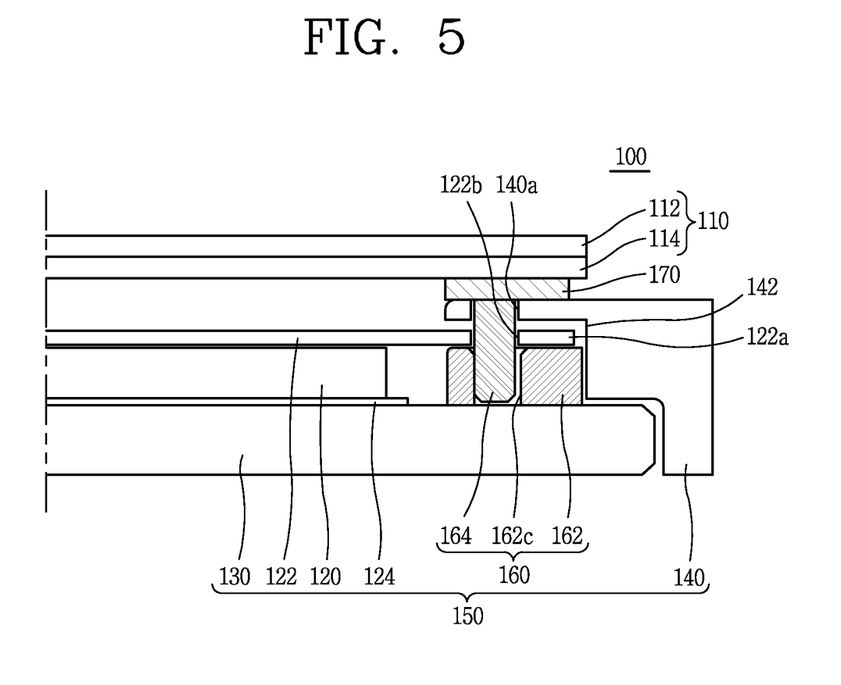
FIG. 5 is a cross-sectional view of a display device according to an embodiment.

FIG. 5 is a cross-sectional view of a display device 100 according to an embodiment.

Referring to FIGS. 2 to 5, a display device 100 having an optical sheet fixating unit according to an embodiment includes a liquid crystal panel 110 and a backlight unit 150 providing light to the liquid crystal panel 110.

As shown in FIG. 5, the liquid crystal panel 110 has a color filter array substrate 112 and a thin film transistor array substrate 114. Liquid crystal cells are arranged in an active matrix form between the color filter array substrate 112 and the thin film transistor (TFT) array substrate 114, and each of the liquid crystal cells has a TFT for switching a video signal.

As a refractive index of each of the liquid crystal cells is changed according to a video signal, an image corresponding to the video signal is displayed on the liquid crystal panel 110.

A gate tape carrier package (not shown in FIG. 5) on which a gate integrated circuit (IC) generating a gate signal is mounted and a data tape carrier package (not shown in FIG. 5) on which a data IC generating a data signal is mounted are provided on the TFT array substrate 114 of the liquid crystal panel 110.

The backlight unit 150 includes a plurality of light sources (not shown in FIG. 5), a light guide plate 120 disposed to face the light sources, an optical sheet 122 disposed above the light guide plate 120, a reflective sheet 124 disposed on a rear surface of the light guide plate 120, a cover bottom 130 on which the reflective sheet 124 and the light guide plate 120 are sequentially stacked and received, a main support 140 covering an outer side of the cover bottom 130 and allowing the liquid crystal panel 110 to be disposed on an upper portion thereof, and a sheet fixating mechanism 160 fixating the optical sheet 122.

Hereinafter, an edge type backlight unit will be described for the purposes of description but a technical concept of the present disclosure is not limited thereto and may also be applied to a direct type backlight unit.

The light source (not shown) may be implemented as at least any one of a light emitting diode (LED), a hot cathode fluorescent lamp (HCFL), a cold cathode fluorescent lamp (CCFL), and an external electrode fluorescent lamp (EEFL). In the present disclosure, a case in which an LED is used as a light source will be described as an example.

The light guide plate 120 is disposed such that at least one side surface thereof faces the light source (not shown). The light guide plate 120 converts light incident from the light source into planar light and allows light to exit to one or more optical sheets 122 disposed thereabove. The light guide plate 120 may be formed of a material having a high refractive index or transmittance, for example, polymethylenemethacrylate (PMA), polycarbonate (PC), polyethylene (PE), a cyclolefin-based resin (COP), and the like, but the material of the light guide plate 120 is not limited thereto.

The reflective plate 124 is disposed below the light guide plate 120 and reflects light traveling in a downward direction toward the light guide plate 120 to an upward direction away from the light guide plate 120, i.e., toward the liquid crystal panel 110 to increase light efficiency of the display device 100.

The optical sheet 122 is disposed between the liquid crystal panel 110 and the light guide plate 120, increases uniformity of light incident through the light guide plate 120, and refracts and collects light to increase brightness. Although not shown in FIG. 5, the optical sheet 122 may include a protective sheet, a prism sheet, a diffusion sheet, and the like. The diffusion sheet diffuses light incident from the light guide plate 120. The prism sheet includes a microprism having a shape of a trigonal prism and collects diffused light incident from the diffusion sheet in a direction perpendicular to a rear surface of the liquid crystal panel 110. The protective sheet protects the prism sheet from damage, for example, due to a scratch.

A plurality of sheet ear parts 122a are formed on one side of the optical sheet 122. The sheet ear parts 122a of the optical sheet 122 are secured to the main support 140 by the sheet fixating mechanism 160. Also, an ear part hole 122b, into which a fixating pin 164 is inserted, is formed in each of the sheet ear parts 122a.

Referring to FIGS. 4 and 5, the main support 140 is a quadrangular mold frame and surrounds and supports other components of the backlight unit 150. A sheet mounting part 142 is formed within one side of the main support 140 in which the sheet ear part 122a of the optical sheet 122 is disposed. Main support fastening parts 142a are provided on both inner sides of the sheet mounting part 142 such that both sides of a sheet mounting member 162 are caught to be secured. The sheet mounting part 142 is defined by carving out a portion of the main support 140 between the main support fastening parts 142a and underneath an upper surface of the main support 140.

An upper hole 140a is formed on the upper surface of the main support 140 at the sheet mounting part 142. The upper hole 140a interfaces with the sheet mounting part 142 and a fixating pin 164 is inserted into the upper hole 140a.

Meanwhile, the sheet fixating mechanism 160 includes the sheet mounting member 162 inserted into the sheet mounting part 142 formed to face the sheet ear part 122a on one side surface of the main support 140. The sheet mounting member 162 has a lower hole 162c into which the fixating pin 164 is inserted. The fixating pin 164 is inserted through the upper hole 140a of the main support 140 and inserted into the ear part hole 122b provided in the sheet ear part 122a of the optical sheet 122 and the lower hole 162c provided in the sheet mounting member 162 so as to fixate the optical sheet 122 to the main support 140.

The sheet mounting member 162 has the lower hole 162c allowing the sheet ear part 122a to be mounted at a central portion thereof and interfacing with the ear part hole 122b of the sheet ear part 122a, and sheet mounting member fastening parts 162b fixedly inserted into the main support fastening part 142a provided at both inner sides of the sheet mounting part 142 of the main support 140.

The sheet mounting member 162 includes a sheet guiding part 162a to which the sheet ear part 122a is guided and mounted, a sheet mounting member fastening parts 162b provided on both sides of the sheet guiding part 162a and secured to the main support fastening part 142a provided at both inner sides of the sheet mounting part 142 when the sheet mounting member 162 is inserted to a rear surface of the main support 140, and a lower hole 162c formed in the sheet guiding part 162a that interfaces with the ear part hole 122b of the sheet ear part 122a.

The sheet mounting member fastening parts 162b protrude in a horizontal direction on both upper sides of the sheet guiding part 162a, and the main support fastening part 142a provided in the main support 140 is engaged to be coupled to the sheet mounting member fastening parts 162b of the sheet mounting member 162.

Also, as shown in FIG. 5, a foam pad 170 covering a portion to which the sheet ear part 122a is fastened, i.e., an upper part of the fixating pin 164, is disposed on an upper surface of the main support 140. The foam pad 170 may fully block a portion of an upper surface of the main support 140, as well as a portion to which the sheet ear part 122a of the optical sheet 122 is inserted and secured, i.e., a portion to which the fixating pin 164 is inserted and fastened.

Thus, in the display device 100 having the optical sheet fixating unit, since the optical sheet 122 is secured by inserting the fixating pin 164 to the upper hole 140a of the main support 140, the ear part hole 122b of the sheet ear part 122a, and the lower hole 162c of the sheet mounting member 162, the optical sheet 122 may be stably secured even in a narrow bezel of the display device 100.

Also, in the display device 100 having the optical sheet fixating unit, since the fixating pin 164 is inserted into the upper hole 140a of the main support 140, the ear part hole 122b of the sheet ear part 122a, and the lower hole 162c of the sheet mounting member 162, a gap is not formed between the optical sheet 122 and the main support 140, and since the foam pad 170 is disposed on an upper surface of the main support 140 including the fixating pin 164, light leakage may be effectively prevented.

In addition, in the display device 100 having the optical sheet fixating unit, since the sheet ear part 122a of the optical sheet 122 is vertically tightly coupled (e.g., attached) and fixed by the fixating pin 164 between the main support 140 and the sheet mounting member 162, the sheet is prevented from being released in a mechanical testing and transportation environment of the display device 100, and unwanted horizontal movement (e.g., due to vibrations during transport or use) of components of the display device 100 may be effectively reduced or prevented.

Figure 6:
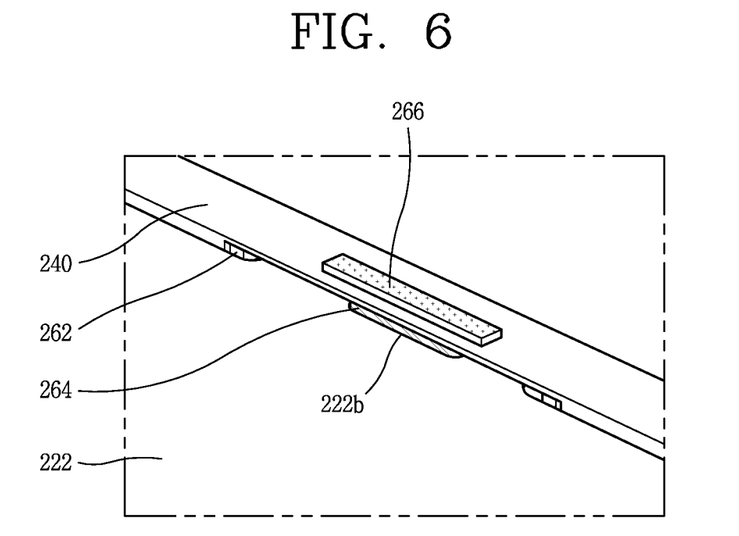
FIG. 6 is a perspective view illustrating an optical sheet of a display device according to an embodiment.

FIG. 6 is a perspective view illustrating an optical sheet 222 of a display device according to an embodiment.

Figure 7:
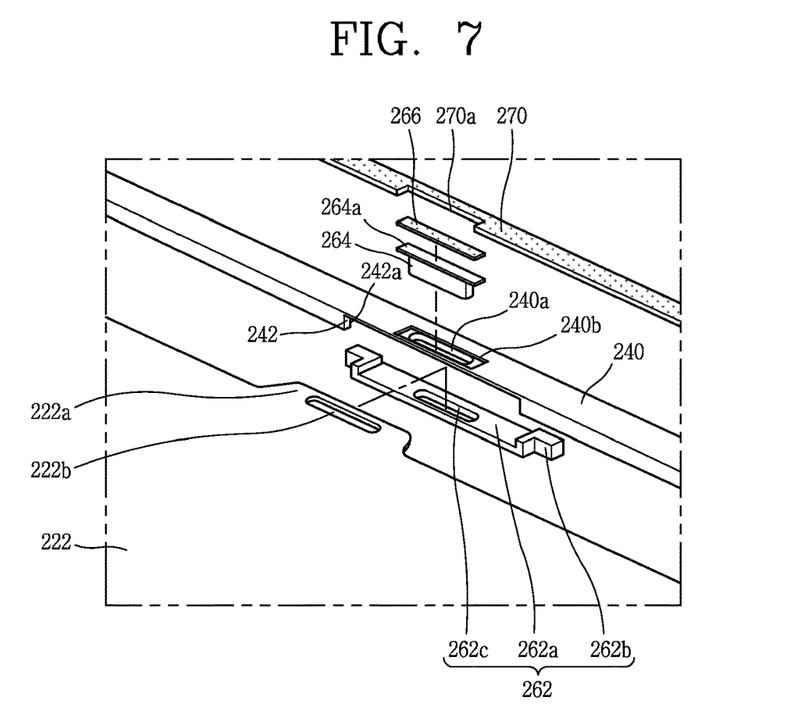
FIG. 7 is a perspective view illustrating an optical sheet of a display device that is disassembled according to an embodiment.

FIG. 7 is a perspective view illustrating an optical sheet 222 of a display device that is disassembled according to an embodiment.

Figure 8:
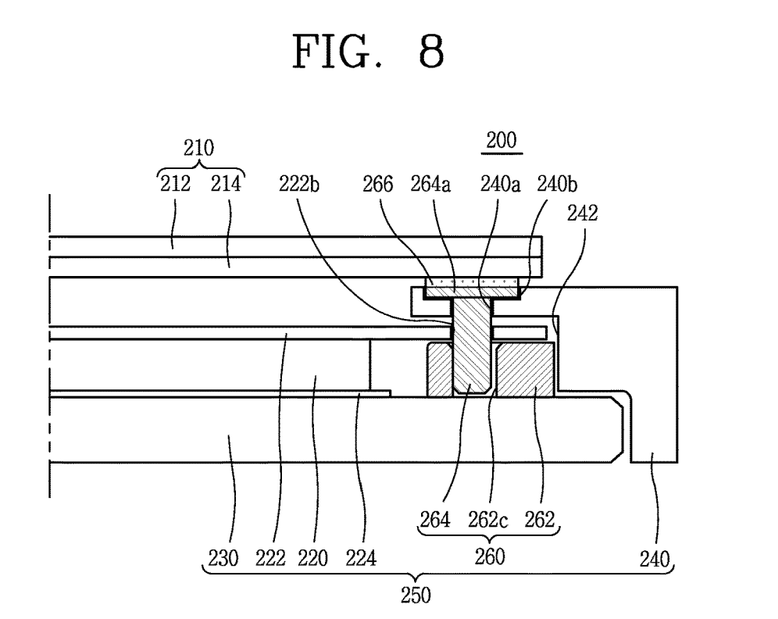
FIG. 8 is a cross-sectional view of a display device according to an embodiment.

FIG. 8 is a cross-sectional view of a display device 200 according to an embodiment.

Referring to FIGS. 6 to 8, a display device 200 having an optical sheet fixating unit of an embodiment includes a liquid crystal panel 210 implementing an image and a backlight unit 250 supplying light to the liquid crystal panel 210.

As shown in FIG. 8, the liquid crystal panel 210 includes a color filter array substrate 212 and a TFT array substrate 214. Liquid crystal cells are arranged in an active matrix form between the color filter array substrate 212 and the TFT array substrate 214, and each of the liquid crystal cells has a TFT for switching a video signal.

As a refractive index of each of the liquid crystal cells is changed according to a video signal, an image corresponding to the video signal is displayed on the liquid crystal panel 210.

A gate tape carrier package (not shown in FIG. 8) on which a gate integrated circuit (IC) generating a gate signal is mounted and a data tape carrier package (not shown in FIG. 8) on which a data IC generating a data signal is mounted are provided on the TFT array substrate 214 of the liquid crystal panel 210.

The backlight unit 250 includes a plurality of light sources (not shown), a light guide plate 220 disposed to face the light sources, an optical sheet 222 disposed above the light guide plate 220, a reflective sheet 224 disposed on a rear surface of the light guide plate 220, a cover bottom 230 on which the reflective sheet 224, the light guide plate 220, and an optical sheet 222 are sequentially stacked and received, a main support 240 covering an outer side of the cover bottom 230 and allowing the liquid crystal panel 210 to be disposed on an upper portion thereof, and a sheet fixating mechanism 260 fixating the optical sheet 222.

Hereinafter, an edge type backlight unit will be described for the purposes of description but a technical concept of the present disclosure is not limited thereto and may also be applied to a direct type backlight unit.

The light source (not shown) may be implemented as at least any one of a light emitting diode (LED), a hot cathode fluorescent lamp (HCFL), a cold cathode fluorescent lamp (CCFL), and an external electrode fluorescent lamp (EEFL). In the present disclosure, a case in which an LED is used as a light source will be described as an example.

The light guide plate 220 is disposed such that at least one side surface thereof faces the light source (not shown). The light guide plate 220 converts light incident from the light source into planar light and allows light to exit. to the plurality of optical sheets 222 disposed thereabove. The light guide plate 220 The light guide plate 220 may be formed of a material having a high refractive index or transmittance, for example, polymethylenemethacrylate (PMA), polycarbonate (PC), polyethylene (PE), a cyclolefin-based resin (COP), and the like, but the material of the light guide plate 220 is not limited thereto.

The reflective plate 224 is disposed below the light guide plate 220 and reflects light traveling in a downward direction toward the light guide plate 220 to an upward direction away from the light guide plate 220, i.e., toward the liquid crystal panel 210 to increase light efficiency of the display device 200.

The optical sheet 222 is disposed between the liquid crystal panel 210 and the light guide plate 220, increases uniformity of light incident through the light guide plate 220, and refracts and collects light to increase brightness. Although not shown in FIG. 8, the optical sheet 222 may include a protective sheet, a prism sheet, a diffusion sheet, and the like. The diffusion sheet diffuses light incident from the light guide plate 220. The prism sheet includes a microprism having a shape of a trigonal prism and collects diffused light incident from the diffusion sheet in a direction perpendicular to a rear surface of the liquid crystal panel 210. The protective sheet protects the prism sheet from damage, for example, due to a scratch.

A plurality of sheet ear parts 222a are formed on one side of the optical sheet 222. The sheet ear parts 222a of the optical sheet 222 are secured to the main support 240 by the sheet fixating mechanism 260. Also, an ear part hole 222b, into which a fixating pin 264 is inserted, is formed in each of the sheet ear parts 222a.

Referring to FIGS. 7 and 8, the main support 240 is a quadrangular mold frame and surrounds and supports other components of the backlight unit 250. A sheet mounting part 242 is formed within one side of the main support 240 in which the sheet ear part 222a of the optical sheet 222 is disposed. A main support fastening part 242a is provided on both inner sides of the sheet mounting part 242 such that both sides of a sheet mounting member 262 are caught to be secured.

An upper hole 240a is formed on an upper surface of the main support 240 at the sheet mounting part 242. The upper hole 240a interfaces with the sheet mounting part 242 and a fixating pin 264 is inserted into the upper hole 240a. A fixating pin mounting part 240b is provided around the upper hole 240a present on an upper surface of the main support 240 and allows a fixating pin maintaining part 264a to be mounted thereon. The fixating pin maintaining part 264a may have a greater width than the fixating pin 264.

As illustrated in FIG. 7, the sheet fixating mechanism 260 includes the sheet mounting member 262 inserted into the sheet mounting part 242 formed to face the sheet ear part 222a on one side surface of the main support 240 and having a lower hole 262c into which the fixating pin 264 is inserted, and a fixating pin 264 inserted through the upper hole 240a of the main support 240 and inserted into the ear part hole 222b provided in the sheet ear part 222a of the optical sheet 222 and the lower hole 262c provided in the sheet mounting member 262 so as to fixate the optical sheet 222. The fixating pin maintaining part 264a is integrally formed with the fixating pin 264 on an upper surface of the fixating pin 264, and an auxiliary foam pad 266 is coupled to an upper part of the fixating pin maintaining part 264a. The auxiliary foam pad 266 may have the same dimensions as the fixating pin maintaining part 264a.

The sheet mounting member 262 includes a sheet guiding part 262a to which the sheet ear part 222a is guided and mounted, a sheet mounting member fastening parts 262b provided on both sides of the sheet guiding part 262a, inserted into a rear surface of the main support 240 so as to be secured to a main support fastening part 242a provided at both inner sides of the sheet mounting part 242, and a lower hole 262c formed in the sheet guiding part 262a that interfaces with the ear part hole 222b of the sheet ear part 222a.

The sheet mounting member fastening parts 262b protrudes in a horizontal direction on both upper sides of the sheet guiding part 262a, and the main support fastening part 242a provided in the main support 240 is engaged to be coupled to the sheet mounting member fastening parts 262b of the sheet mounting member 262.

Also, as shown in FIG. 7, a foam pad 270 covering a portion to which the sheet ear part 122a is fastened, e.g., a portion excluding an upper part of the auxiliary foam pad 266 bonded to the fixating pin maintaining part 264a of the fixating pin 264, is disposed on an upper surface of the main support 240. The foam pad 270 may fully shield an upper surface of the main support 240, excluding a portion to which the sheet ear part 222a of the optical sheet 222 is inserted and fixed, e.g., a portion of the auxiliary foam pad 266 as a portion to which the fixating pin 264 is inserted. The auxiliary foam pad 266 may be disposed to be flush with the foam pad 270.

In particular, in a state in which the auxiliary foam pad 266 covers the upper portion of the fixating pin 264, i.e., the upper portion of the fixating pin maintaining part 264, an upper surface of the main support 240 excluding the upper part of the fixating pin maintaining part 264a is covered using the foam pad 270, whereby an assembly process of the display device 200 may be simplified and an assembly time may be reduced. The auxiliary foam pad 266 and the foam pad 270 may be assembled in series or parallel.

Thus, in the display device 200 having an optical sheet fixating unit, since the optical sheet 222 is secured by inserting the fixating pin 264 to the upper hole 240a of the main support 240, the ear part hole 222b of the sheet ear part 222a, and the lower hole 262c of the sheet mounting member 262, the optical sheet 222 may be stably secured even in a narrow bezel of the display device 200.

Also, in the display device 200 having the optical sheet fixating unit, since the fixating pin 264 having the auxiliary foam pad 266 thereon is inserted into the upper hole 240a of the main support 240, the ear part hole 222b of the sheet ear part 222a, and the lower hole 262c of the sheet mounting member 262, a gap is not formed between the optical sheet 222 and the main support 240, and since the foam pad 270 is disposed on an upper surface of the main support 240 excluding the upper part of the fixating pin maintaining part 264a, light leakage may be effectively prevented.

In addition, in the display device 200 having the optical sheet fixating unit, since the sheet ear part 222a of the optical sheet 222 is vertically tightly coupled (e.g., attached) and fixed by the fixating pin 264 between the main support 240 and the sheet mounting member 262, the sheet is prevented from being released in a mechanical testing and transportation environment of the display device 200, and unwanted horizontal movement (e.g., due to vibrations during transport or use) of components of the display device 200 may be effectively reduced or prevented.

Embodiments of the sheet mounting members of the backlight unit will be described with reference to FIGS. 9 to 11.

Figure 9:
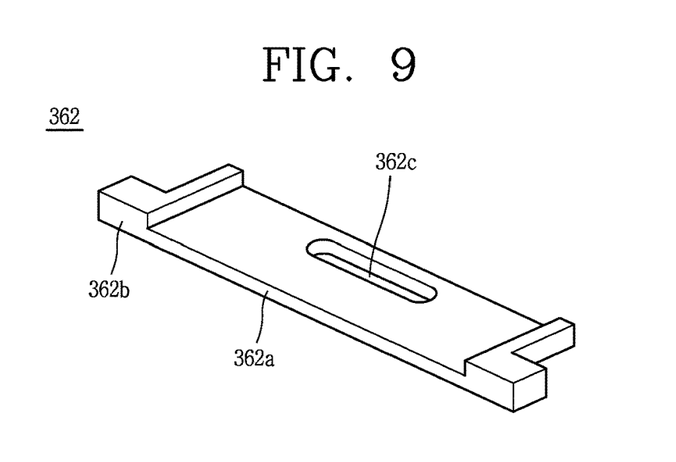
FIG. 9 is a view illustrating an example of a sheet mounting member for a backlight unit according to an embodiment.

FIG. 9 is a view illustrating an example of a sheet mounting member 362 for a backlight unit according to an embodiment.

Referring to FIG. 9, a sheet mounting member 362 according to an embodiment includes a sheet guiding part 362a on which the sheet ear part (e.g., 122a of FIG. 4) of the optical sheet (e.g., 122 of FIG. 5) is mounted, a sheet mounting member fastening parts 362b provided on both sides of the sheet guiding part 362a and having a thickness greater than that of the sheet guiding part 362a, and a lower hole 362c provided in the sheet guiding part 362a.

The sheet mounting member fastening parts 362b of the sheet mounting member 362 have a shape of a protrusion protruding in a horizontal direction from a lower portion of both side surfaces of the sheet mounting member 362.

The sheet mounting member 362 having the sheet mounting member fastening parts 362b as a protrusion protruding in a horizontal direction from a lower portion of both side surfaces is inserted into the sheet mounting part (e.g., 142 of FIG. 4) of the main support (e.g., 140 of FIG. 4) in an inward direction of the main support 140, and the sheet mounting member fastening parts 362b as a protrusion is inserted and fastened to a main support fastening part (e.g., 142a of FIG. 4) provided on both sides of the main support 140.

Since the sheet mounting member 362 is inserted and assembled to the sheet mounting part 142 of the main support 140 in an inward direction of the main support 140, assembling is facilitated in manufacturing the backlight unit.

Figure 10:
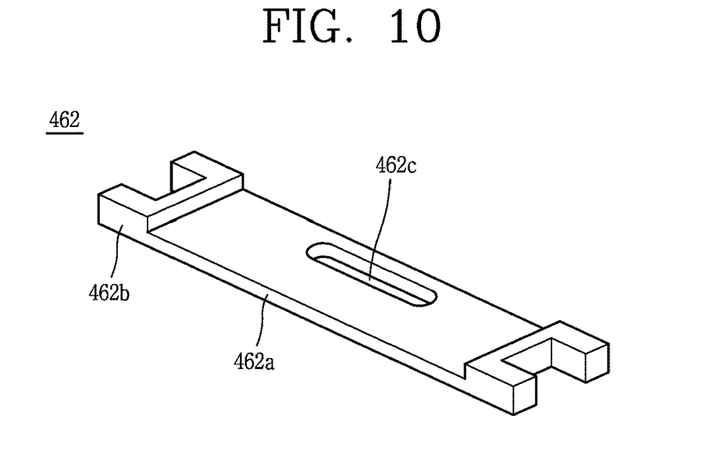
FIG. 10 is a view illustrating another example of a sheet mounting member for a backlight unit according to an embodiment.

FIG. 10 is a view illustrating another example of a sheet mounting member 462 for a backlight unit according to an embodiment.

Referring to FIG. 10, a sheet mounting member 462 according to an embodiment includes a sheet guiding part 462a on which the sheet ear part (e.g., 122a of FIG. 4) of the optical sheet (e.g., 122 of FIG. 5) is mounted, a sheet mounting member fastening parts 462b provided on both sides of the sheet guiding part 462a and having a thickness greater than that of the sheet guiding part 462a, and a lower hole 462c provided in the sheet guiding part 462a.

The sheet mounting member fastening parts 462b of the sheet mounting member 462 have a shape of a protrusion protruding in a horizontal direction from upper and lower portion of both side surfaces of the sheet mounting member 462.

The sheet mounting member 462 having the sheet mounting member fastening parts 462b as a protrusion protruding in a horizontal direction on upper and lower portions of both side surfaces is inserted into the sheet mounting part (e.g., 142 of FIG. 4) of the main support (e.g., 140 of FIG. 4) in an rear surface direction of the main support 140, and the sheet mounting member fastening parts 462b as a protrusion is inserted and fastened to a main support fastening part (e.g., 142a of FIG. 4) provided on both sides of the main support 140.

Since the sheet mounting member 462 is inserted and assembled to the sheet mounting part 142 of the main support 140 in the rear surface direction of the main support 140, assembling is facilitated in manufacturing the backlight unit but the sheet mounting member 462 may be appropriate for vibration impact.

Figure 11:
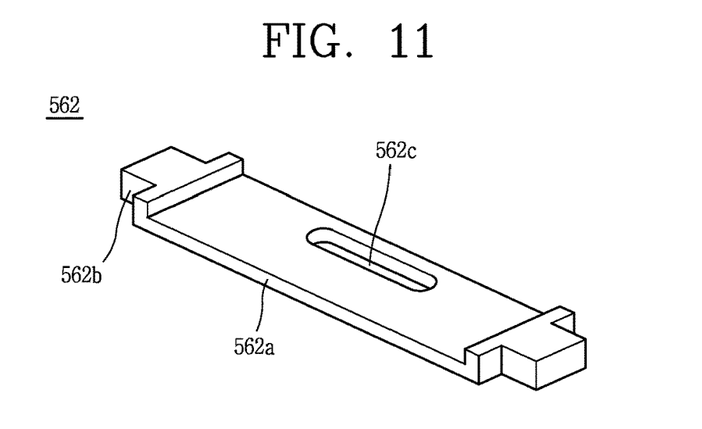
FIG. 11 is a view illustrating another example of a sheet mounting member for a backlight unit according to an embodiment.

FIG. 11 is a view illustrating another example of a sheet mounting member 562 for a backlight unit according to an embodiment.

Referring to FIG. 11, a sheet mounting member 562 according to an embodiment includes a sheet guiding part 562a on which the sheet ear part (e.g., 122a of FIG. 4) of the optical sheet (e.g., 122 of FIG. 5) is mounted, a sheet mounting member fastening parts 562b provided on both sides of the sheet guiding part 562a and having a thickness greater than that of the sheet guiding part 562a, and a lower hole 562c provided in the sheet guiding part 562a.

The sheet mounting member fastening parts 562b of the sheet mounting member 562 have a shape of a protrusion protruding in a horizontal direction from a central portion of both side surfaces of the sheet mounting member 562.

The sheet mounting member 562 having the sheet mounting member fastening parts 562b as a protrusion protruding in a horizontal direction from the central portion of both side surfaces is inserted into the sheet mounting part (e.g., 142 of FIG. 4) of the main support (e.g., 140 of FIG. 4) in an rear surface direction of the main support 140, and the sheet mounting member fastening parts 562b as a protrusion is inserted and fastened to a main support fastening part (e.g., 142a of FIG. 4) provided on both sides of the main support 140.

Since the sheet mounting member 562 is inserted and assembled to the sheet mounting part 142 of the main support 140 in the rear surface direction of the main support 140, assembling is facilitated in manufacturing the backlight unit but the sheet mounting member 562 may be appropriate for vibration impact.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the embodiments described herein may be combined in various ways to obtain additional and/or alternative embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A backlight unit comprising:
a light source providing light;
an optical sheet including a sheet ear part extending from one side and formed with an ear part hole;
a main support, in which the sheet ear part of the optical sheet is disposed, the main support formed with a sheet mounting part, in which the sheet ear part of the optical sheet is disposed, and an upper through hole;
a sheet mounting member inserted into the sheet mounting part of the main support for mounting the sheet ear part of the optical sheet and formed with a lower through hole; and
a fixating pin inserted through the upper through hole of the main support, the ear part hole of the optical sheet, and the lower through hole of the sheet mounting member to fix the sheet ear part of the optical sheet to the main support.

2. The backlight unit of claim 1, further comprising:
a light guide plate disposed to face the light source;
a reflective sheet disposed below the light guide plate;
a cover bottom in which the reflective sheet, the light source, and the light guide plate are received; and
a foam pad disposed on an upper surface of the main support to cover the fixating pin.

3. The backlight unit of claim 1, further comprising:
a fixating pin maintaining part disposed on an upper surface of the fixating pin; and
an auxiliary foam pad disposed on an upper surface of the fixating pin maintaining part.

4. The backlight unit of claim 3, further comprising:
a foam pad disposed on the main support excluding the auxiliary foam pad.

5. The backlight unit of claim 4, wherein the foam pad has a same pattern recess as that of the auxiliary foam pad, the auxiliary foam pad being positioned within the pattern recess.

6. The backlight unit of claim 3, wherein the fixating pin maintaining part has a greater width than the upper through hole, and the auxiliary foam pad has a same width as the fixating pin maintaining part.

7. The backlight unit of claim 1, wherein the sheet mounting member includes:
- a sheet guiding part mounted with the sheet ear part of the optical sheet;
- a sheet mounting member fastening part on a side of the sheet guiding part, and having a thickness greater than a thickness of the sheet guiding part.

8. The backlight unit of claim 7, wherein the sheet mounting member fastening part of the sheet mounting member includes a protrusion protruding in a horizontal direction from a lower portion of the side, a protrusion protruding in a horizontal direction from each of the lower portion and an upper portion of the side, or a protrusion protruding in a horizontal direction from a central portion of the side.

9. The backlight unit of claim 8, wherein the sheet mounting member is inserted into the sheet mounting part of the main support in an inward direction of the main support, the protrusion of the sheet mounting member fastening part contacting a main support fastening part of the main support.

10. The backlight unit of claim 8, wherein the sheet mounting member is inserted into the sheet mounting part of the main support in a rear direction of the main support, the protrusion of the sheet mounting member fastening part contacting a main support fastening part of the main support.

11. A display device comprising:
- an optical sheet including a sheet ear part extending from one side, the sheet ear part formed with an ear part hole;
- a main support formed with a sheet mounting part, in which the sheet ear part of the optical sheet is disposed, and an upper through hole;
- a sheet mounting member inserted into the sheet mounting part of the main support to engage main support fastening parts with the sheet ear part between an upper surface of the sheet mounting member and the bottom portion of the main support, the sheet mounting member formed with a lower through hole that aligns with the ear part hole and the upper through hole; and
- a fixating pin inserted through the upper through hole, the ear part hole, and the lower through hole to secure the sheet ear part of the optical sheet between the main support and the sheet mounting member.

12. The display device of claim 11, further comprising a foam pad on the main support to cover the sheet fixating pin.

13. The display device of claim 11, wherein the sheet mounting member includes at least one sheet mounting member fastening part configured to engage with at least one of the main support fastening parts to restrict movement of the sheet mounting member relative to the main support.

14. The display device of claim 11, wherein the fixating pin includes a fixating pin maintaining part having greater width than the upper through hole, and wherein an auxiliary foam pad having a same width as the fixating pin maintaining part is placed on an upper surface of the fixating pin maintaining part.

15. The display device of claim 14, further comprising a foam pad on the main support, the foam pad having a carved out portion shaped to correspond to a shape of the auxiliary foam pad.

16. The display device of claim 15, wherein the auxiliary foam pad is disposed in the carved out portion of the foam pad and is flush with the foam pad.

17. The display device of claim 11, wherein the sheet mounting member comprises sheet mounting member fastening parts that engage with the main support fastening parts and a sheet guiding part between the sheet mounting member fastening parts having a thickness thinner than a thickness of the sheet mounting member fastening parts, the sheet guiding part formed with the lower through hole.

18. The display device of claim 17, wherein each of the sheet mounting member fastening parts of the sheet mounting member includes a protrusion protruding in a direction parallel to an upper surface of the sheet guiding part, the protrusion coming into contact with one of the main support fastening parts.

19. The display device of claim 18, wherein the sheet mounting member is pushed in an inward direction towards the optical sheet for receiving the fixating pin in the lower through hole.

* * * * *